United States Patent [19]
Chan et al.

[11] Patent Number: 5,696,021
[45] Date of Patent: Dec. 9, 1997

[54] METHOD OF MAKING A FIELD OXIDE ISOLATION STRUCTURE

[75] Inventors: Tsiu Chiu Chan, Carrollton; Frank R. Bryant, Denton, both of Tex.

[73] Assignee: SGS-Thomson Microelectronics, Inc., Carrollton, Tex.

[21] Appl. No.: 474,537

[22] Filed: Jun. 7, 1995

Related U.S. Application Data

[63] Continuation of Ser. No. 114,671, Aug. 31, 1993, abandoned.

[51] Int. Cl.$^6$ .................................................. H01L 21/76
[52] U.S. Cl. .................................................. 437/72; 437/968
[58] Field of Search ............ 437/72, 968; 148/DIG. 50, 148/DIG. 85, DIG. 86, DIG. 117

[56] References Cited

U.S. PATENT DOCUMENTS

| | | | |
|---|---|---|---|
| 4,508,757 | 4/1985 | Fabricius et al. | 437/69 |
| 4,611,386 | 9/1986 | Goto | 437/72 |
| 4,835,115 | 5/1989 | Eklund | 437/69 |
| 4,873,203 | 10/1989 | Kaga et al. | |
| 5,028,559 | 7/1991 | Zdebel et al. | |
| 5,096,848 | 3/1992 | Kawamura | |
| 5,106,777 | 4/1992 | Rodder | 437/72 |
| 5,116,779 | 5/1992 | Iguche | 437/70 |

FOREIGN PATENT DOCUMENTS

| | | |
|---|---|---|
| 0137195 | 4/1985 | European Pat. Off. . |
| 377871 | 7/1990 | European Pat. Off. . |
| 0641022 | 3/1995 | European Pat. Off. . |
| 58-127344 | 7/1983 | Japan . |
| 58-220444 | 12/1983 | Japan . |
| 60-38832 | 2/1985 | Japan . |
| 61-85838 | 5/1986 | Japan . |
| 344060 | 2/1991 | Japan . |
| 3110856 | 5/1991 | Japan . |
| 4152549 | 5/1992 | Japan . |

OTHER PUBLICATIONS

"Double Trench Isolation (DTI): A Novel Isolation Technology for Deep-Submicron Silicon Devices" VLSI Symposium Digest, May, 1993 11-1 T. Park et al., pp. 137-138.

*Primary Examiner*—George Fourson
*Attorney, Agent, or Firm*—Theodore E. Galanthay; Kenneth C. Hill; Lisa K. Jorgenson

[57] ABSTRACT

A method for creating isolation structures in a substrate without having to increase the field implant doses to prevent punch through. This particular advantage is achieved by first growing a pad oxide on the substrate. Polysilicon is deposited on top of the pad oxide layer. Next, silicon nitride, used for masking, is deposited on the polysilicon layer. An opening, also called an isolation space, is etched into the three layers, exposing part of the substrate. A first field oxide is grown in the opening. This first field oxide layer is etched to expose a portions of the substrate along the edge of the field oxide region. Then, trenches are etched into the exposed portions of the substrate, and field implantation of dopants is performed. After implantation, a second field oxide layer is grown. The silicon nitride, polysilicon, and pad oxide are then removed, resulting in the isolation structure of the present invention.

37 Claims, 3 Drawing Sheets

METHOD OF MAKING A FIELD OXIDE ISOLATION STRUCTURE

This is a continuation of application Ser. No. 08/114,671, filed Aug. 31, 1993, abandoned.

BACKGROUND OF THE INVENTION

1. Field of the Invention

The present invention relates to integrated devices and more specifically to isolation structures in semiconductors.

2. Description of the Prior Art

Various isolation structures employing materials such as field oxide have been used to isolate devices. As devices become smaller, such as deep-submicron silicon devices, it is desirable to decrease or reduce the isolation spaces. Reducing isolation spaces with local oxidation of silicon (LOCOS) or modifications of LOCOS requires increased field implant doses to prevent punch through. One draw back of increasing the implant dose is that the junction breakdown is reduced and junction leakage is increased.

Trench methods of isolation have been used to increase the channel length and therefore reduce the punch through. These methods, however, have some difficulty in filling variable width trenches and are sometimes difficult to process. Double trench isolation is one system used to isolate devices. See Park et al., *Double Trench Isolation* (DTI): *A Novel Isolation Technology for Deep-Submicron Silicon Devices*, VLSI Symposium Digest, May, 1993. Presently known methods for creating double trench isolation structures are complex. For example, the Park et al. method requires placement and removal of silicon nitride spacers in the isolation space to provide windows for creating of trenches.

Therefore, it would be desirable to have a simple method for producing a uniform trench size at the isolation edge, which increases the channel length and is easy to fill.

SUMMARY OF THE INVENTION

The present invention provides a method for creating isolation structures in a substrate without having to increase the field implant doses to prevent punch through. This particular advantage is achieved by creating an oxidation barrier by first growing a pad oxide on the substrate. Next, polysilicon is deposited on top of the pad oxide layer. Then, silicon nitride, used for masking, is deposited on the polysilicon layer. An opening, also called an isolation space, is etched into the three layers, exposing part of the substrate. The pad oxide layer need not be removed in all cases when forming the isolation space. A first field oxide is grown in the opening. This first field oxide layer is etched to expose a portion of the substrate along the edge of the field oxide region. Then, trenches are etched into the exposed portion of the substrate, and field implantation of dopants is performed. After implantation, a second field oxide layer is grown. The silicon nitride, polysilicon, and pad oxide are then removed, resulting in the isolation structure of the present invention.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
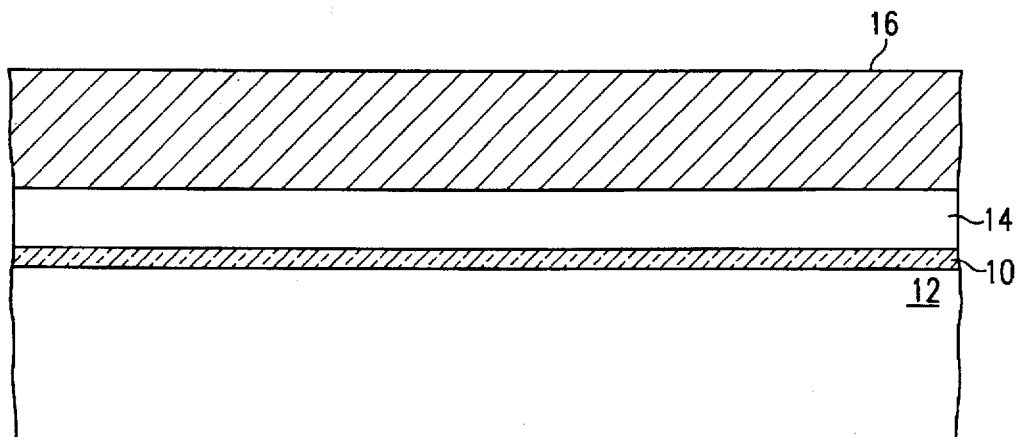
FIG. 1 is a cross-section illustrating an initial layer of pad oxide, polysilicon, and silicon nitride.

According to a preferred embodiment of the present invention, pad oxide layer 10 is deposited on substrate 12 in a layer that is about 50 Å thick, as shown in FIG. 1. Pad oxide is a thin, thermal stress-relief $SiO_2$ layer. A polysilicon layer 14 is deposited on top of pad oxide 10 in a layer that is about 200 Å thick. Silicon nitride layer 16 is deposited over polysilicon layer 14 as a barrier for oxide growth. Silicon nitride 16 is deposited in a layer of about 1500 Å in this embodiment but may range from about 500 Å to about 2500 Å. Silicon nitride is useful as a masking layer for selective oxidation because it is difficult for oxygen to penetrate silicon nitride. Additionally, silicon nitride is highly suitable as a passivation layer. Other layers for masking LOCOs may be used if desired.

Figure 2:
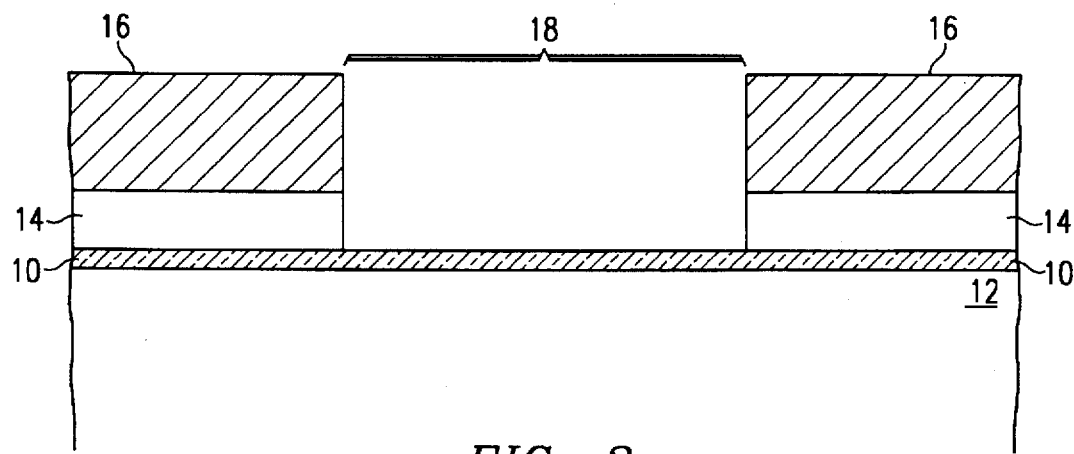
FIG. 2 shows an isolation space created by etching.
Figure 3:
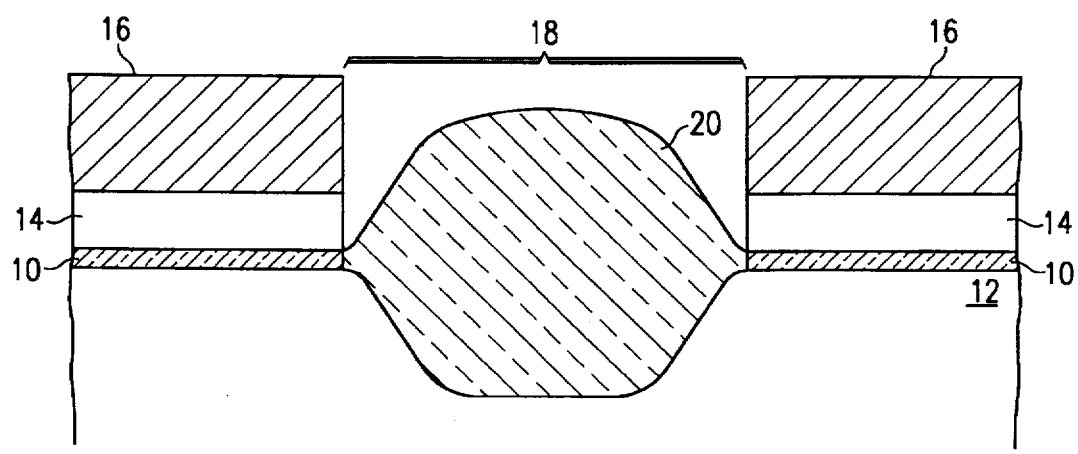
FIG. 3 illustrates growth of a field oxide layer on the substrate.

Referring to FIG. 2, isolation space 18 is created by pattern and etch methods well known to those skilled in the art. For example, isolation space 18 may be etched using a dry anisotropic etch. Pad layer 10 may or may not be removed in creating isolation space 18. Field oxide layer 20 is grown to a thickness that is about 2000 Å above the substrate as illustrated in FIG. 3.

Figure 4:
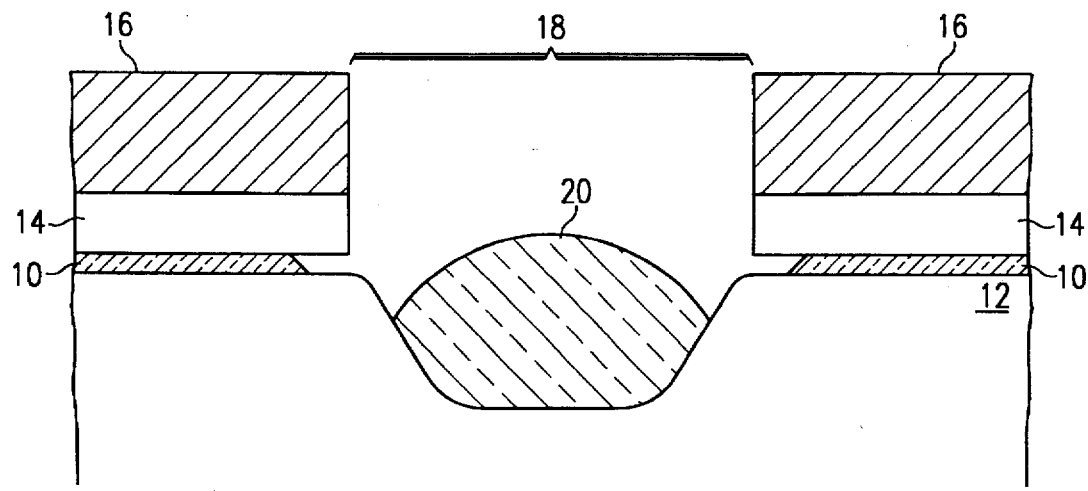
FIG. 4 shows a structure resulting from etching the field oxide layer.
Figure 5:
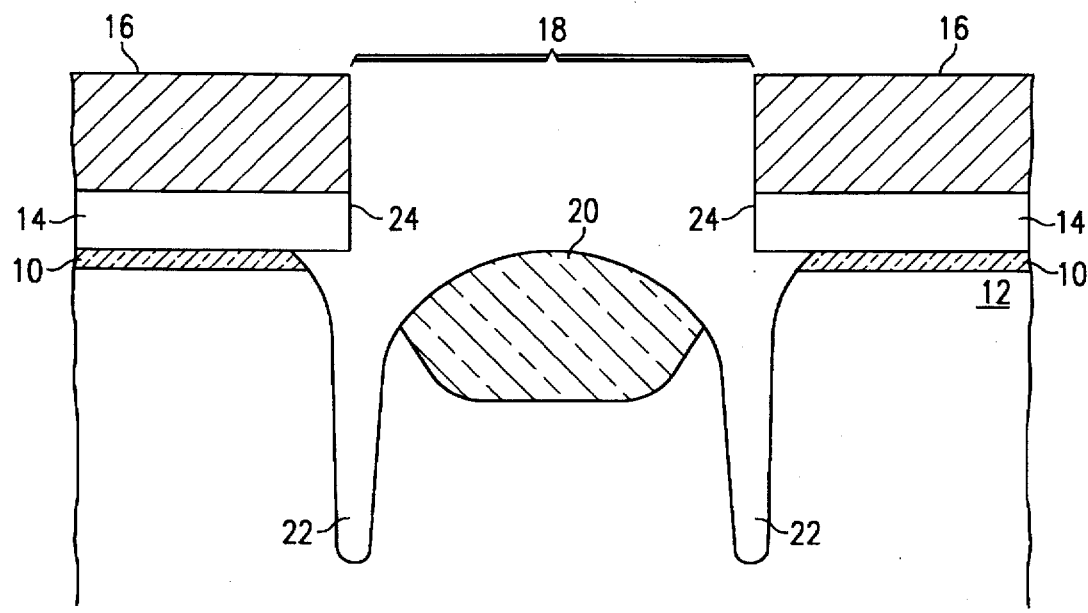
FIG. 5 shows two trenches etched into the substrate.

Field oxide layer 20 is then etched using hydrogen fluoride, HF, resulting in the structure shown in FIG. 4. About 1000 Å of field oxide layer 20 is removed using HF, exposing areas of substrate at the edges of the field oxide region. FIG. 5 illustrates trenches 22 that have been etched in the exposed substrate 12 by isolation edges 24. Trenches 22 may be etched using an anisotropic etch. Each trench 22 is etched to about 5000 Å deep and 1500 Å wide. After etching trenches 22, channel stop implants are formed by implanting dopants into the trenches as is shown in FIG. 6.

Figure 6:
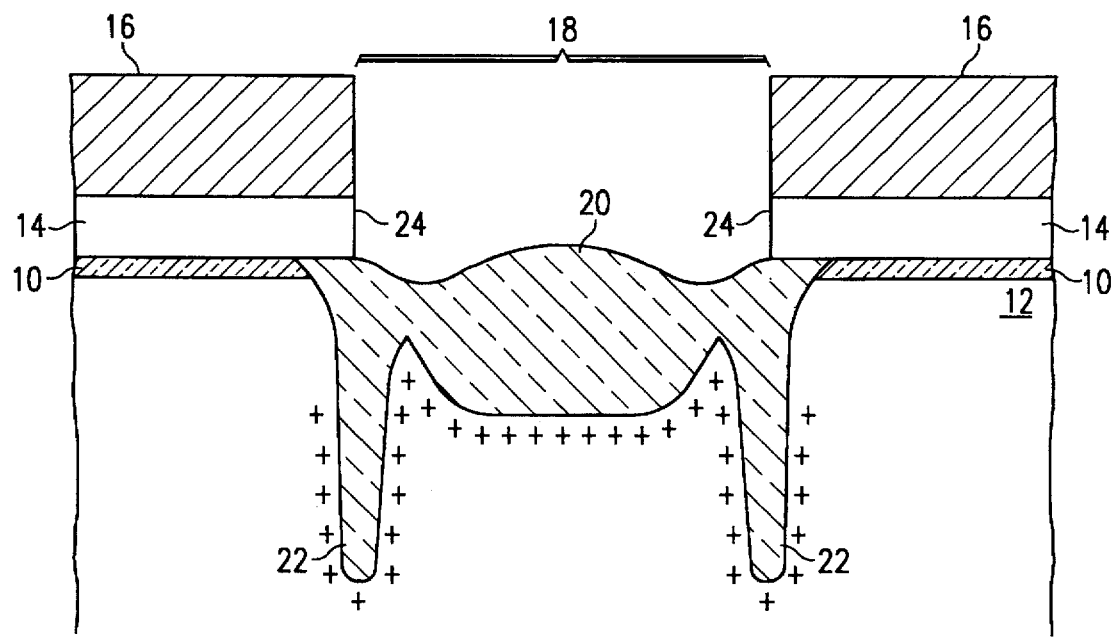
FIG. 6 shows filling of the trenches shown in FIG. 5.

Then, trenches 22 may be filled by growing field oxide as shown in FIG. 6. The field oxide thickness is grown to 2500 Å according to a preferred embodiment of the present invention.

Optionally, trenches 22 may be filled by growing about 500 Å of pad oxide or thin oxide in trenches 22, depositing polysilicon into trenches 22, then etching back the polysilicon from the silicon nitride to leave trenches 22 filled. The part of polysilicon and substrate is then oxidized to form field oxide 20 with a thickness of about 2500 Å. Only the top portion of the polysilicon is oxidized in accordance with a preferred embodiment of the present invention. This type of formation aids in relieving stress in the isolation structure.

Figure 7:
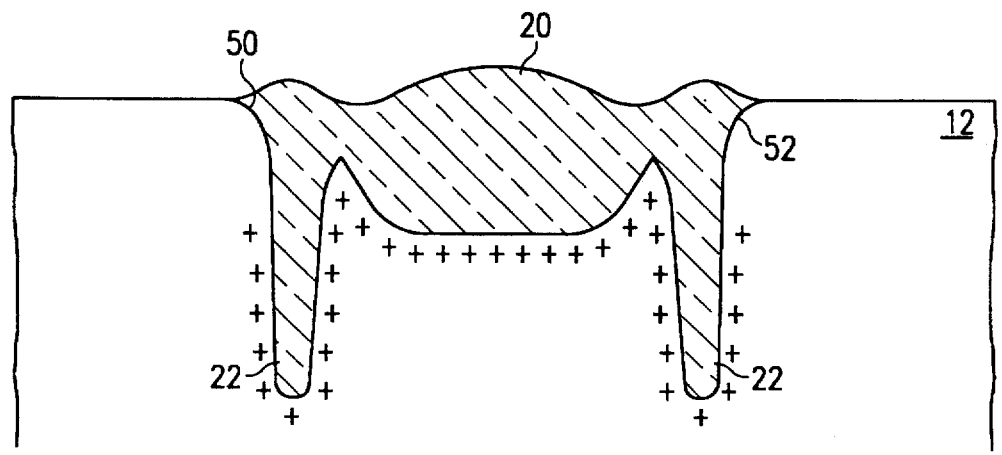
FIG. 7 shows the final form of the isolation structure after the pad oxide, polysilicon, and silicon nitride are removed.

Afterward, silicon nitride 16, polysilicon 14, and pad oxide layer 10 are removed to leave the double trench isolation structure shown in FIG. 7. Further processing is standard to form active devices, etc.

Although the embodiment depicted above defined specific parameters, the parameters may be varied according to the present invention. For example, pad oxide layer 10 may range from about 25 Å to about 150 Å and silicon nitride layer 16 may vary from about 500 Å to about 2500 Å. Field oxide layer 18 may range from about 500 Å to about 4000 Å. From about 500 Å to about 3000 Å may be etched from field oxide layer 20.

Trenches may be etched to any desired level in the substrate. Although the depicted embodiment shows two trenches, other numbers of trenches may be formed, such as one or three. When the trenches are filled, the field oxide layer produced may range from about 1000 Å to about 4000 Å above the substrate layer.

Isotropic wet chemical etching is used to etch the field oxide layer 20 in the depicted embodiment. HF is employed in the depicted embodiment, but other types of etches, such as, for example, HF mixed with $NH_4F$ may be used according to the present invention. The etch used should be one that will etch field oxide, but does not attack silicon nitride or monocrystalline silicon. Additionally, the etch should etch field oxide at a slow enough rate to provide good control as to the amount of field oxide removed.

The amount of dopants implanted into the substrate may be decreased by providing long channels. Additionally, the amount of dopants implanted into the substrate may be reduced relative to LOCOS or relative to a global trench process.

The isolation/active transition is smoother in the trenches produced according to the present invention at points 50 and 52 as shown in FIG. 7. The use of silicon nitride spacers results in sharper transitions at these two points. The trenches are etched using an anisotropic etch. Etching procedures using plasma etching, freon, $SiF_2$ gases may be employed.

Thus, the present invention provides a method for creating an isolation structure that provides uniform trench sizes at the isolation edges. One advantage of this structure over others is reduced layout pitch, longer path lengths minimized latchup, and small amounts of deep oxide cause less stress as opposed to etching the whole depth. With less stress, less substrate leakage occurs from defects. Additionally, another advantage of creating trenches with the present invention is higher isolation voltages may be achieved and reduced active/active punch through occurs. The method also is less complex than existing methods, eliminating the need for silicon nitride spacers.

Another advantage of the present invention over using silicon nitride spacers is that the isolation/active transition, at points 50 and 52 in FIG. 7, are smoother due to the double bird's beak formed. A smooth transition such as that provided by the present invention is not found with processes using nitride spacers.

While the invention has been particularly shown and described with reference to a preferred embodiment, it will be understood by those skilled in the art that various changes in form and detail may be made therein without departing from the spirit and scope of the invention.

What is claimed is:

1. A method for creating an isolation structure in a substrate, comprising:

forming an oxidation barrier over a substrate;

forming an opening in the oxidation barrier to define a first region;

oxidizing the substrate in the first region to form a field oxide layer;

removing part of the field oxide layer to expose a portion of the substrate in the opening while leaving a portion of the field oxide layer in the opening;

forming a trench in the exposed portion of the substrate; and oxidizing exposed surfaces of a material in the trench to form a second field oxide layer filling the trench.

2. The method of claim 1 further comprising implanting a dopant in the trench prior to the step of oxidizing exposed surfaces of a material in the trench to form a field oxide layer filling the trench.

3. A method for creating an isolation structure in a substrate, comprising:

forming an oxidation barrier over a substrate;

forming an opening in the oxidation barrier to define a first region;

oxidizing the substrate in the first region to form a field oxide layer;

removing part of the field oxide layer to expose two spaced portions of the substrate in the opening while leaving a portion of the field oxide layer in the opening;

forming trenches in the exposed portions of the substrate;

depositing polysilicon over the oxidation barrier and in the trenches, wherein the trenches are filled with polysilicon;

etching away polysilicon from the oxidation barrier; and oxidizing a top portion of the polysilicon to form the second field oxide layer that fills the trenches.

4. The method of claim 1, wherein the oxidation barrier is formed by:

growing a pad oxide layer on the substrate;

depositing a polysilicon layer on the pad oxide layer; and depositing a silicon nitride layer on the polysilicon layer.

5. The method of claim 1, wherein the step of forming and opening comprises etching the oxidation barrier with an anisotropic etch.

6. The method of claim 1, wherein the step of removing part of the field oxide layer comprises etching the field oxide layer with an isotropic etch.

7. The method of claim 1, wherein the step of removing part of the field oxide layer comprises wet isotropic etching of the field oxide layer.

8. The method of claim 1, wherein the step of removing part of the layer of field oxide comprises etching the field oxide layer with hydrogen fluoride.

9. The method of claim 1, wherein the step of forming a trench comprises etching the exposed portion of substrate with an anisotropic etch.

10. The method of claim 1, wherein the step of forming a trench comprises etching the exposed portion of the substrate with a dry anisotropic etch.

11. The method of claim 3, wherein the second field oxide layer is about 1000 Å to about 4000 Å thick.

12. A method for creating an isolation structure in a substrate comprising:

growing a pad oxide layer on the substrate;

depositing a first polysilicon layer over the pad oxide layer;

depositing a silicon nitride layer over the first polysilicon layer;

creating an isolation space in the silicon nitride, first polysilicon and pad oxide layers exposing a section of the substrate;

growing a first field oxide layer on the exposed substrate;

etching the first field oxide layer to expose a portion of the substrate in the isolation space while leaving a portion of the first field oxide layer in the isolation space;

etching at least one trench in the exposed portion of the substrate;

growing a second field oxide layer, wherein the at least one trench is filled with oxide; and removing the silicon nitride, polysilicon, and pad oxide layers.

13. The method of claim 12, wherein the etching is anisotropic etching.

14. The method of claim 13, wherein the anisotropic etching is dry anisotropic etching.

15. The method of claim 14, wherein the dry anisotropic etching is performed in a plasma etching system.

16. The method of claim 12, wherein the step of etching the first field oxide layer includes isotropic etching of the first field oxide layer.

17. The method of claim 12, wherein the step of etching the first field oxide layer includes wet isotropic etching of the first field oxide layer.

18. The method of claim 12, wherein the step of etching the first field oxide layer includes wet isotropic etching of the first field oxide layer with hydrogen fluoride.

19. The method of claim 12, wherein the step of etching at least one trench includes anisotropic etching.

20. The method of claim 12, wherein the step of etching at least one trench includes dry anisotropic etching.

21. The method of claim 12 further comprising implanting a dopant in the at least one trench prior to the step of growing a second field oxide layer.

22. The method of claim 12, wherein the pad oxide layer is from about 25 Å to about 500 Å.

23. The method of claim 12, wherein the first polysilicon layer is from about 50 Å to about 500 Å.

24. The method of claim 12, wherein the silicon nitride layer is from about 500 Å to about 2500 Å.

25. The method of claim 12, wherein the first field oxide layer is from about 500 Å to about 4000 Å.

26. The method of claim 12, wherein, about 500 Å to about 3000 Å of the first field oxide layer is etched to expose a preselected area of substrate.

27. The method of claim 12, wherein the second field oxide layer is about 1000 Å to about 4000 Å.

28. A method for creating an isolation structure in a substrate comprising:

growing a pad oxide layer from about 25 Å to about 150 Å thick on the substrate;

depositing a first polysilicon layer from about 50 Å to about 500 Å thick on the pad oxide layer;

depositing a silicon nitride layer from about 500 Å to about 2500 Å thick on the first polysilicon layer;

creating an isolation space in the pad oxide, first polysilicon, and silicon nitride layers to expose a section of substrate;

growing a first field oxide layer from about 500 Å to about 4000 Å thick on the exposed substrate;

etching away about 500 Å to about 3000 Å of the first field oxide layer to expose a portion of the substrate previously exposed;

etching at least one trench in the exposed portion of the section of the substrate;

implanting a dopant in the at least one trench;

growing a second field oxide layer in the trench, wherein the at least one trench is filled and the second field oxide layer is about 1000 Å to about 4000 Å above the substrate; and removing the silicon nitride, polysilicon, and pad oxide layers.

29. A method for creating an isolation structure in a substrate comprising:

growing a pad oxide layer from about 25 Å to about 150 Å thick on the substrate;

depositing a first polysilicon layer from about 50 Å to about 500 Å thick on the pad oxide layer;

depositing a silicon nitride layer from about 500 Å to about 2500 Å thick on the first polysilicon layer;

creating an isolation space in the pad oxide, first polysilicon, and silicon nitride layers to expose a section of substrate;

growing a first field oxide layer from about 500 Å to about 3000 Å thick on the exposed section of substrate;

etching away about 500 Å to about 3000 Å of the first field oxide layer to expose two spaced portions of the substrate previously exposed;

etching trenches in the exposed portions of the section of the substrate;

growing a thin oxide from about 50 Å to about 1000 Å in the trenches;

implanting a dopant in the trenches;

depositing polysilicon over the nitride layer and in the trenches, wherein the trenches are filled with polysilicon;

etching away polysilicon from the nitride layer;

oxidizing a top portion of the polysilicon to form poly filled trenches in the trenches; and removing the silicon nitride, polysilicon, and pad oxide layers.

30. The method of claim 1, wherein the step of forming an oxidation barrier includes:

growing a pad oxide layer from about 25 Å to about 150 Å thick on the substrate;

depositing a first polysilicon layer on the pad oxide layer; and depositing a silicon nitride layer on the first polysilicon layer.

31. A method for creating an isolation structure in a substrate comprising:

forming an oxidation barrier over a substrate;

forming an opening in the oxidation barrier to define a first region;

oxidizing the substrate in the first region to form a field oxide layer;

removing part of the field oxide layer, wherein a portion of the field oxide layer in a central region of the opening remains and the substrate is exposed along at least part of a peripheral region in the opening;

forming a trench in the exposed portion of the substrate; and oxidizing exposed surfaces of a material in the trench to form a second field oxide layer filling the trench.

32. The method of claim 31, further comprising implanting a dopant in the trench prior to the step of oxidizing exposed surfaces of a material in the trench.

33. The method of claim 31, wherein the step of oxidizing exposed surfaces of a material in the trench to form a second field oxide layer filling the trench comprises:

depositing polysilicon over the oxidation barrier and in the trench, wherein the trench is filled with polysilicon;

etching away polysilicon from the oxidation barrier; and oxidizing a top portion of the polysilicon to form the second field oxide layer that fills the trench.

34. The method of claim 31, wherein the step of forming an oxidation barrier includes:

growing a pad oxide layer on the substrate;

depositing a first polysilicon layer on the pad oxide layer; and depositing a silicon nitride layer on the first polysilicon layer.

35. The method of claim 30, wherein the pad oxide layer is from about 25 Å to about 500 Å.

36. The method of claim 30, wherein the first polysilicon layer is from about 50 Å to 500 Å.

37. The method of claim 30, wherein the silicon nitride layer is from about 500 Å to about 2500 Å.

* * * * *